(12) United States Patent
Angioni et al.

(10) Patent No.: US 10,826,011 B1
(45) Date of Patent: Nov. 3, 2020

(54) QLED FABRICATED BY PATTERNING WITH PHASE SEPARATED EMISSIVE LAYER

(71) Applicant: Sharp Kabushiki Kaisha, Osaka (JP)

(72) Inventors: Enrico Angioni, Oxford (GB); Tim Michael Smeeton, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 16/519,329

(22) Filed: Jul. 23, 2019

(51) Int. Cl.
*H01L 51/50* (2006.01)
*H01L 27/32* (2006.01)
*H01L 51/00* (2006.01)
*H01L 51/56* (2006.01)

(52) U.S. Cl.
CPC ........ *H01L 51/502* (2013.01); *H01L 27/3246* (2013.01); *H01L 51/0007* (2013.01); *H01L 51/5056* (2013.01); *H01L 51/5072* (2013.01); *H01L 51/56* (2013.01); *H01L 51/006* (2013.01); *H01L 51/0058* (2013.01); *H01L 51/0061* (2013.01); *H01L 51/0065* (2013.01)

(58) Field of Classification Search
CPC ............... H01L 51/502; H01L 27/3246; H01L 51/5072; H01L 51/5056
See application file for complete search history.

(56) References Cited

U.S. PATENT DOCUMENTS 7,910,400 B2   3/2011   Kwon et al.
2017/0155051 A1   6/2017   Torres et al.

FOREIGN PATENT DOCUMENTS

WO   WO 2017117994 A1   7/2017
WO   WO 2017121163 A1   7/2017

OTHER PUBLICATIONS

Joon-Suh Park et al.: "Alternative Patterning Process for Realization of Large-Area, Full-Color, Active Quantum Dot Display", DOI: 10.1021/acs.nanolett.6b03007 Nano Lett. 2016, 16, 6946-6953.
Abhinav M. Gaikwad et al.: "Identifying orthogonal solvents for solution processed organic transistors", Organic Electronics 30 (2016) 18-29.

(Continued)

*Primary Examiner* — Anthony Ho
(74) *Attorney, Agent, or Firm* — Renner, Otto, Boisselle & Sklar, LLP

(57) ABSTRACT

A light-emitting device includes a combined charge transport and emissive layer (CCTEL). The light-emitting device includes an anode, a cathode, and a CCTEL disposed between the anode and the cathode, the CCTEL comprising a crosslinked charge transport material and quantum dots. The quantum dots are distributed unevenly within the crosslinked charge transport material. The quantum dots may be phase separated from the crosslinked charge transport material whereby the quantum dots form a layer at least partially within the CCTEL at or adjacent to an outer surface of the CCTEL closest to the cathode or the anode. The quantum dots may phase separate from the crosslinked material at least in part during the deposition of a mixture including the crosslinked material and quantum dots in a solvent, as the solvent component of the mixture evaporates. The quantum dots may phase separate from the crosslinked material at least in part in response to an activation stimulus, such as exposure to UV light.

14 Claims, 8 Drawing Sheets

(56) References Cited

OTHER PUBLICATIONS

Seth Coe-Sullivan et al.: "Tuning the performance of hybrid organic/inorganic quantum dot light-emitting devices", Organic Electronics 4 (2003) 123-130.
Seth Coe-Sullivan et al.: "Large-Area Ordered Quantum-Dot Monolayers via Phase Separation During Spin-Casting", Adv. Funct. Mater. 2005, 15, 1117-1124, DOI: 10.1002/adfm.200400468.

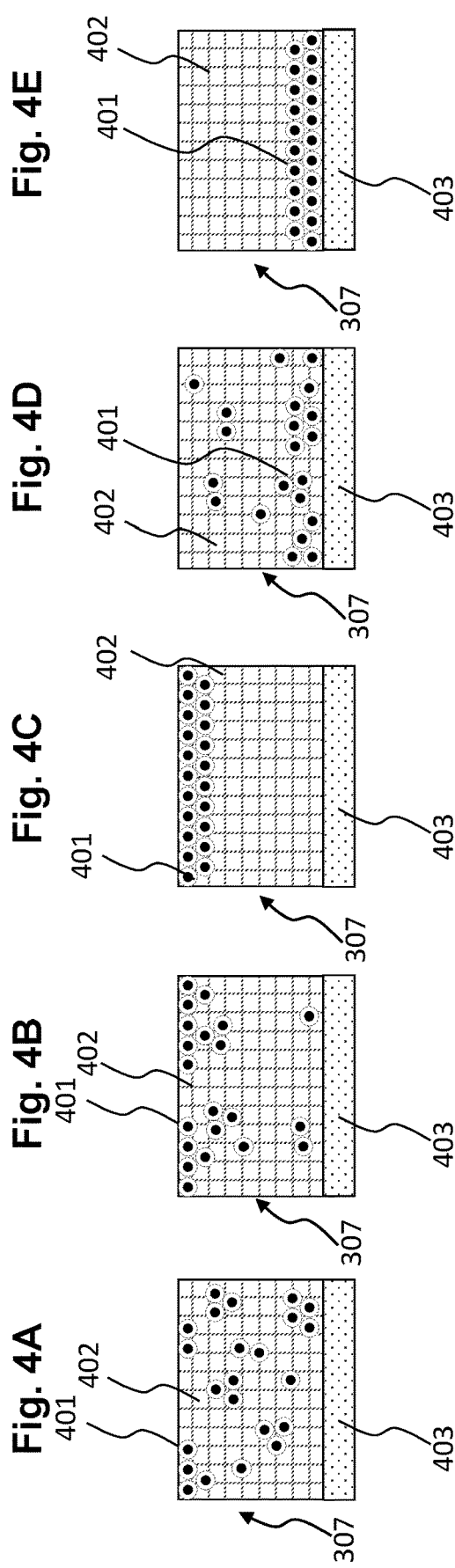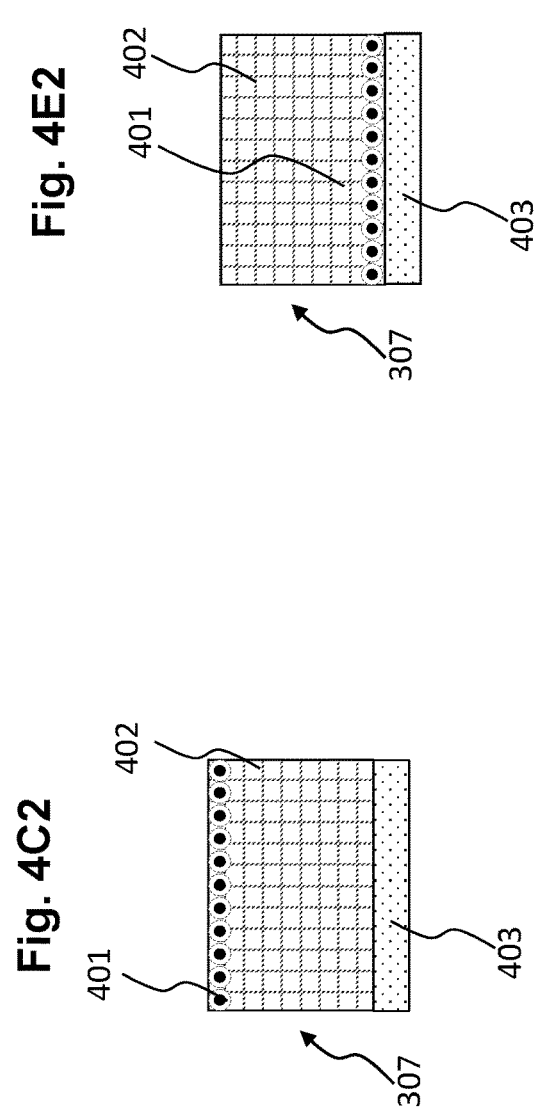

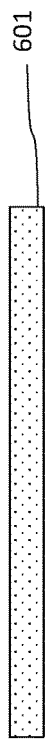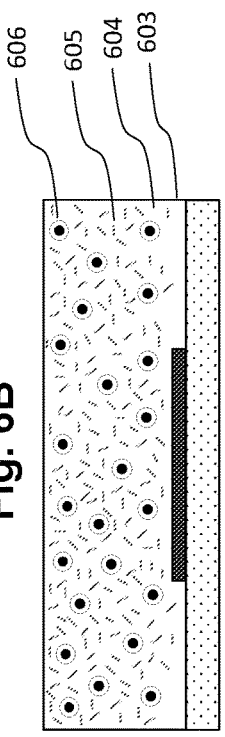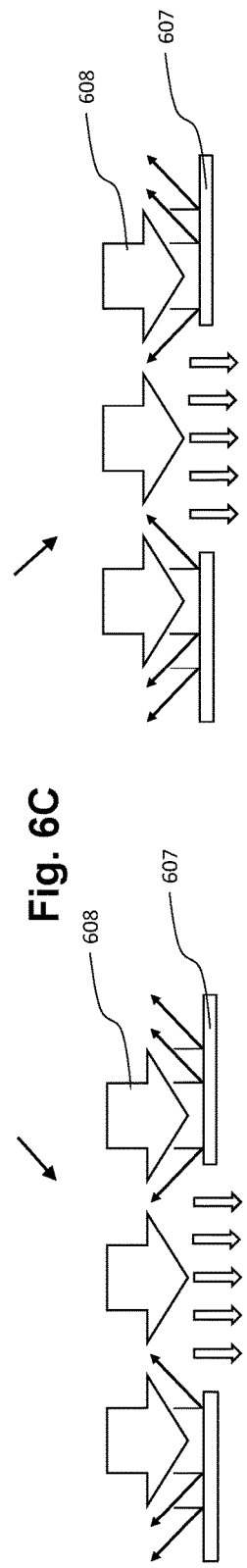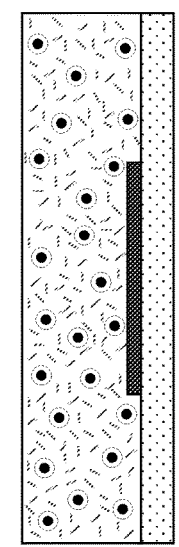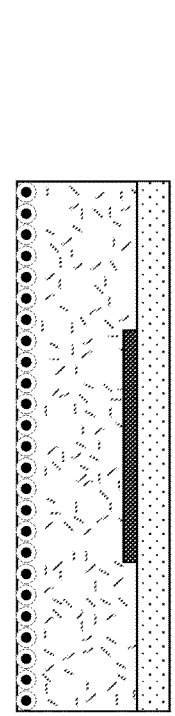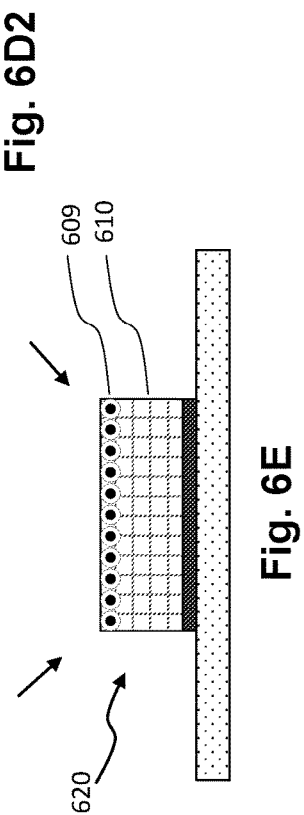

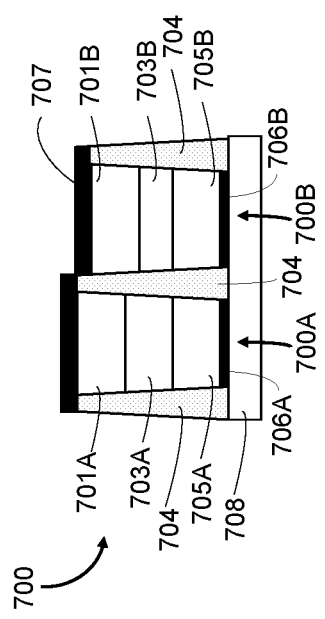
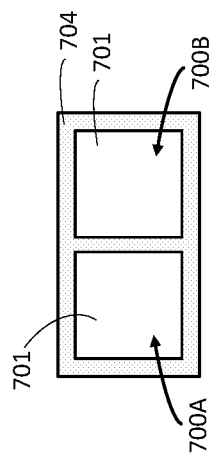
Fig. 7A
Fig. 7B

QLED FABRICATED BY PATTERNING WITH PHASE SEPARATED EMISSIVE LAYER

TECHNICAL FIELD

The present application relates to light-emitting devices, and in particular to light-emitting devices including a cross-linked emissive layer containing nanoparticles. The light-emitting devices may be implemented in display applications, for example in high resolution, multicolor displays. The present application further relates to methods of fabricating such light-emitting devices.

BACKGROUND ART

A common architecture for a light-emitting device includes an anode, which acts as hole injector; a hole transport layer disposed on the anode; an emissive material layer disposed on the hole transport layer; an electron transport layer disposed on the emissive material layer; and a cathode, which also acts as an electron injector, disposed on the electron transport layer. When a forward bias is applied between the anode and cathode, holes and electrons are transported in the device through the hole transport layer and electron transport layer, respectively. The holes and electrons recombine in the emissive material layer, which generates light that is emitted from the device. When the emissive material layer includes an organic material, the light-emitting device is referred to as an organic light-emitting diode (OLED). When the emissive material layer includes nanoparticles, sometimes known as quantum dots (QDs), the device is commonly referred to as either a quantum dot light-emitting diode (QLED, QD-LED) or an electroluminescent quantum dot light-emitting diode (ELQLED, QDEL).

Each of the layers of the light-emitting device can be deposited by different methods with the common methods including thermal evaporation methods and solution process methods. Thermal evaporation methods are widely used for OLEDs, but they are more complex and have higher costs of fabrication as compared to solution process methods. Solution process methods are thus preferred as a cheaper and simpler fabrication methods. However, in the fabrication of devices with these methods, it is important to find the appropriate solvents such that during the deposition of a particular layer, the process will not dissolve or otherwise damage the previously deposited layer. Such a non-damaging solvent is typically referred to in the art as "orthogonal" to the previous one (See Organic Electronics 30 (2016) 18e29; http://dx.doi.org/10.1016/j.orgel.2015.12.008).

To include QLEDs in multicolor high resolution displays, different manufacturing methods have been designed. These methods typically include depositing three different types of QDs on three different regions of a substrate such that each region emits light (through electrical injection; i.e. by electroluminescence) at three different colors, particularly red (R), green (G) and blue (B). Sub-pixels that respectively emit red, green, or blue light may collectively form a pixel, which in turn may be a part of an array of pixels of the display.

Various processing methods for improved manufacturing of such devices have been described. U.S. Pat. No. 7,910,400 (Kwon et al., issued Mar. 22, 2011) describes that QD films can be made more uniform using wet-type film exchanging ligand processes, in which QDs can be connected to each other using organic ligands with particular functional groups at both ends (e.g. thiol, amine, carboxyl functional groups). US 2017/0155051 (Torres Cano et al., published Jun. 1, 2017) describes that QDs can be synthesized with polythiol ligands, which can lead to better packing when deposited and further cured by thermal processes. WO 2017/117994 (Li et al., published Jul. 13, 2017) describes that through external energy stimuli (e.g. pressure, temperature or UV irradiation), QDs which emit different colors can be selectively attached to bonding surfaces. Surfaces and ligands of QDs must contain particular ending functional groups (e.g. alkenes, alkynes, thiols) to be selectively strongly bonded to each other through chemical reactions. This concept is further expanded in WO 2017/121163 (Li et al., published Jul. 20, 2017), in which QDs with R, G and B emission colors can be patterned separately using cross-linkable ligands and organic connectors through chemical reactions that are activated selectively with UV radiation applied at different monochromatic wavelengths. Park et al., Alternative Patterning Process for Realization of Large-Area, Full-Color, Active Quantum Dot Display (Nano Letters, 2016, pages 6946-6953) describes that QDs with R, G and B emission colors are patterned by combining conventional photolithography and layer by layer assembly. QD layers are deposited selectively on activated (charged) surfaces.

Coe-Sullivan et al., "Tuning the Performance of Hybrid Organic/Inorganic Quantum Dot Light-Emitting Devices", Organic Electronics 4 (2003) 123-130 (DOI: 10.1016/j.orgel.2003.08.016) describes an EML/CTM structure in which a mixture of nanocrystals (QDs) and an organic host material (N, N'-diphenyl-N, N'-bis(3-methylphenyl)-(1, 1'-biphenyl)-4, 4'-diamine, TPD) in a solvent is deposited by spin casting on a substrate. The mixture shows phase segregation as the solvent dries during this process forming a bilayer structure where QDs assemble as a monolayer on top of the host material. This structure is used to fabricate a working QLED device. Coe-Sullivan et al., "Large-Area Ordered Quantum-Dot Monolayers via Phase Separation During Spin-Casting", Adv. Funct. Mater. 2005, 15, 1117-1124 (DOI: 10.1002/adfm.200400468) expands further this structure, using different organic host materials, solvents, QDs and substrates. The Coe-Sullivan structures are shown only with Cd-based, Pb-based and Gold QDs, and thus are of limited applicability to useful applications. Only small molecules (e.g., TPD, NPD) and polymers (poly-TPD and the like) are used as organic host materials.

Even with such processes, issues remain as to how to fabricate and deposit the various device layers in a manner that achieves optimal distribution of the quantum dots within the emissive layer for peak light emission efficiency.

SUMMARY OF INVENTION

The present application describes an enhanced QD-LED layer structure and related methods of fabricating such a structure that achieve optimal distribution of the quantum dots within the emissive layer for peak efficiency for the emission of light. In contrast to conventional configurations, a light-emitting device fabricated in accordance with embodiments of the present application includes a combined charge transport and emissive layer (CCTEL), which combines properties of a charge transport layer and an emissive layer. By using a CCTEL, additional charge transport layers may be rendered superfluous, which results in a structure that is smaller in size, easier to fabricate, and includes fewer deficiencies caused by interactions at layer interfaces.

The CCTEL includes a charge transport material and emissive quantum dots in which holes and electrons recombine to emit light. The charge transport material is chemically cross-linked. In exemplary embodiments, the quantum dots are distributed unevenly throughout the charge transport material of the CCTEL. In a preferred embodiment, a phase separation process is employed such that quantum dots are distributed principally in a particular portion of the CCTEL, such as within a lower or upper half of the charge transport material. The phase separation method may be employed to form a segregated monolayer of quantum dots located at least partially within the CCTEL and at or adjacent to an outer surface of the CCTEL.

An aspect of the invention, therefore, is a light-emitting device that includes a combined charge transport and emissive layer (CCTEL) to enhance light output efficiency. In exemplary embodiments, the light-emitting device includes an anode, a cathode, and a CCTEL disposed between the anode and the cathode, the CCTEL comprising a crosslinked charge transport material and quantum dots. The quantum dots are distributed unevenly within the crosslinked charge transport material. For example, the quantum dots may be segregated from the crosslinked charge transport material whereby the quantum dots are located in a half portion of the CCTEL closest to the cathode, and in particular may form a layer or monolayer of quantum dots at least partially within the CCTEL at or adjacent to an outer surface of the CCTEL closest to the cathode. As another example, the quantum dots may be segregated from the crosslinked charge transport material whereby the quantum dots are located in a half portion of the CCTEL closest to the anode, and in particular may form a layer or monolayer of quantum dots at least partially within the CCTEL at or adjacent to an outer surface of the CCTEL closest to the anode. Multiple light-emitting devices may be combined into a bank structure of multiple light-emitting devices to form a pixel structure or pixel array.

Another aspect of the invention is a method of forming a combined charge transport and emissive layer (CCTEL) of a light-emitting device, including the steps of: depositing a mixture comprising quantum dots and a cross-linkable material in a solvent on a base layer; and subjecting at least a portion of the mixture to an activation stimulus to crosslink the cross-linkable material. During at least one of the depositing and subjecting steps, the CCTEL phase separates to include a first portion and a second portion that are linked to each other, and wherein the first portion comprises mainly the crosslinked material relative to the second portion, and the second portion comprises mainly quantum dots that segregate from the crosslinked material. The quantum dots may phase separate from the crosslinked material at least in part during the deposition process as the solvent in the mixture containing the quantum dots and the cross-linkable material evaporates. Additionally or alternatively, the quantum dots may phase separate from the crosslinked material at least in part in response to the activation stimulus, such as in response to exposure to UV light. Accordingly, the precise timing and nature of the segregation may vary. The base layer may include a substrate, an electrode, and/or one of a hole transporting layer or an electron transporting layer, and/or one of a hole transport layer having a cross-linkable hole transport material and the activation stimulus crosslinks the hole transport layer with the first portion of the CCTEL, or an electron transport layer having a cross-linkable electron transport material, and the activation stimulus cross-links the electron transport layer with the first portion of the CCTEL.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF DRAWINGS

FIGS. 4A, 4B, 4C, 4C2, 4D, 4E, and 4E2 are drawings depicting cross-sections of an exemplary combined charge transport and emissive layer (CCTEL) in accordance with embodiments of the present application, illustrating variations of uneven quantum dot distribution within the CCTEL.

FIGS. 6A, 6B, 6C, 6D1, 6D2, and 6E are drawings depicting a progression of steps constituting an exemplary method of fabricating a light-emitting device in accordance with embodiments of the present application.

FIGS. 7A and 7B are drawings depicting an arrangement of multiple light-emitting devices formed in accordance with embodiments of the present application.

DESCRIPTION OF EMBODIMENTS

Figure 1B:
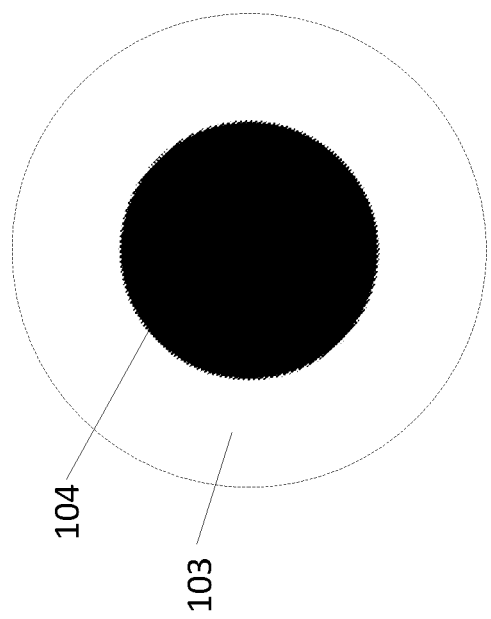
FIG. 1A and FIG. 1B are drawings depicting a two-dimensional schematic representation of a conventional core-shell QD as may be employed in a conventional emissive layer.

Embodiments of the present invention will now be described with reference to the drawings, wherein like reference numerals are used to refer to like elements throughout. It will be understood that the figures are not necessarily to scale.

Figure 1A:
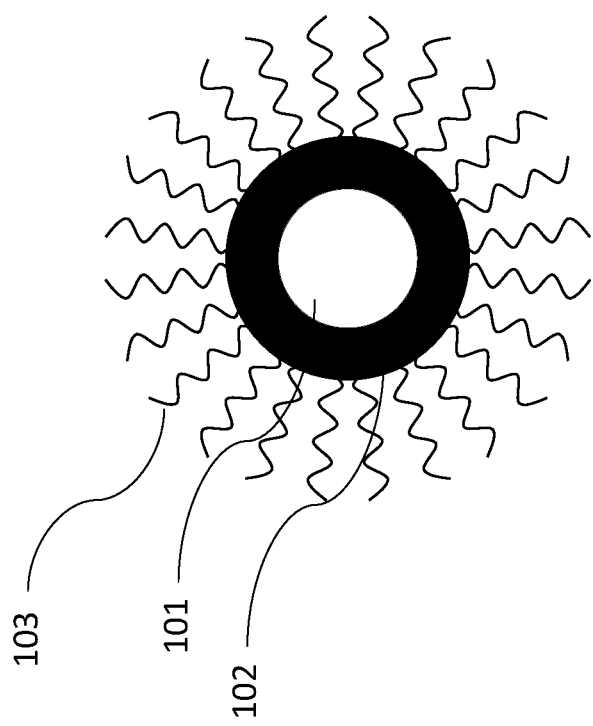

FIG. 1A and FIG. 1B are drawings depicting a two-dimensional schematic representation of a conventional core-shell QD as may be employed in a conventional emissive layer. The quantum dots may be configured as nanoparticles. A nanocrystalline core 101 is co-crystallised with a shell of a compatible material 102, which is then surrounded by ligands 103 that passivate crystal defects in the core-shell QD and allow and improve solubility in common solvents. FIG. 1B is a schematic simplified version of FIG. 1A used for more convenient representation of QDs in a light-emitting device structure, depicting a generalized core-shell QD structure 104 surrounded by a region of ligands 103.

Exemplary quantum dot core and shell materials include one or more of: InP, CdSe, CdS, CdSe$_x$S$_{1-x}$, CdTe, Cd$_x$Zn$_{1-x}$Se, Cd$_x$Zn$_{1-x}$Se$_y$S$_{1-y}$, ZnSe, ZnS, ZnS$_x$Te$_{1-x}$, ZnSe$_x$Te$_{1-x}$, perovskites of the form ABX$_3$, Zn$_w$CuIn$_{1-(w+z)}$S, and carbon, where 0≤w, x, y, z≤1. Exemplary ligands 103 include alkyl, -alkenyl, -alkynyl or aryl (linear, branched or cyclic) thiols with 1 to 30 atoms of carbon; alkyl, -alkenyl, -alkynyl or aryl (linear, branched or cyclic) carboxylic acids with 1 to 30 atoms of carbon; tri-alkyl, -alkenyl, -alkynyl or aryl (linear, branched or cyclic) phosphine oxides with 1 to 60 atoms of carbon; alkyl, -alkenyl, -alkynyl or aryl (linear, branched or cyclic) amines with 1 to 30 atoms of carbon. It will be appreciated that while the present disclosure primarily describes the quantum dots as core-shell quantum dots, in some embodiments the quantum dots may not be of the core-shell type or they may be of a core/multiple-shells type having more than one shell. The non-core-shell type quantum dots may be made from one or more of the above-mentioned materials, and the quantum dots in accordance with the present disclosure may not include a core-shell configuration.

Figure 2:
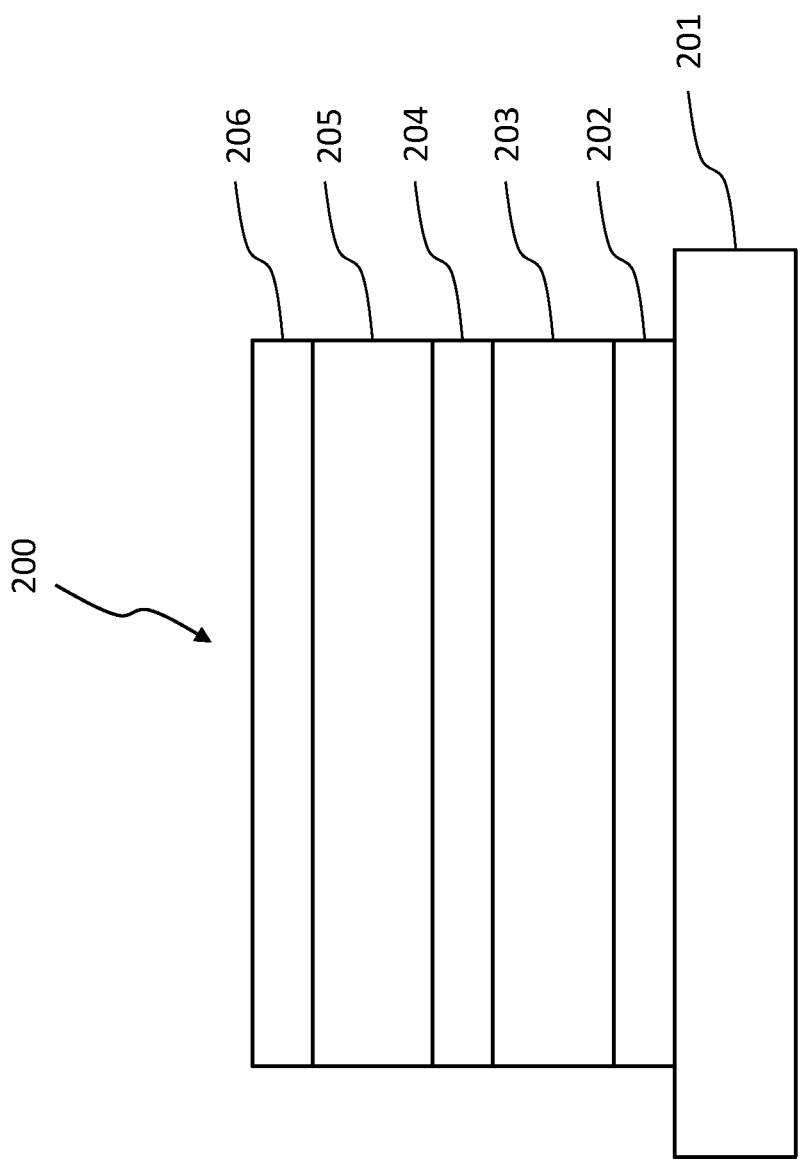
FIG. 2 is a drawing depicting a cross-section of a conventional QD-LED structure.

FIG. 2 is a drawing depicting a cross-section of a configuration of a conventional QD-LED 200 structure. Several planar layers are disposed on a substrate 201, including: a first electrode 202; a second electrode 206; an emissive layer (EML) 204 disposed between the first electrode 202 and the second electrode 206; one or more first charge transport layers (CTL) 203 disposed between the first electrode 202 and the emissive layer 204; and one or more second charge transport layers 205 disposed between the second electrode 206 and the emissive layer 204. A QLED with what is commonly known as a "conventional structure" may have a structure wherein the first electrode 202 is an anode, the one or more first charge transport layers are hole transport layers 203, the one or more second transport layers 205 are electron transport layers, and the second electrode 206 is a cathode. A QLED with what is commonly known as an "inverted structure" may have a structure wherein the first electrode 202 is a cathode, the one or more first charge transport layers 203 are electron transport layers, the one or more second transport layers 205 are hole transport layers, and the second electrode 206 is an anode. During operation, a bias is applied between the anode and the cathode. The cathode injects electrons into the adjacent CTL, and likewise the anode injects holes into the adjacent CTL. The electrons and holes propagate through the CTLs to the EML, where they radiatively recombine and light is emitted. A QLED may be described as "bottom-emitting" if light is primarily emitted out of the substrate 201 side, and a QLED may be described as "top-emitting" if light is primarily emitted out of the second electrode 206 side opposite from the substrate 201.

Figure 3:
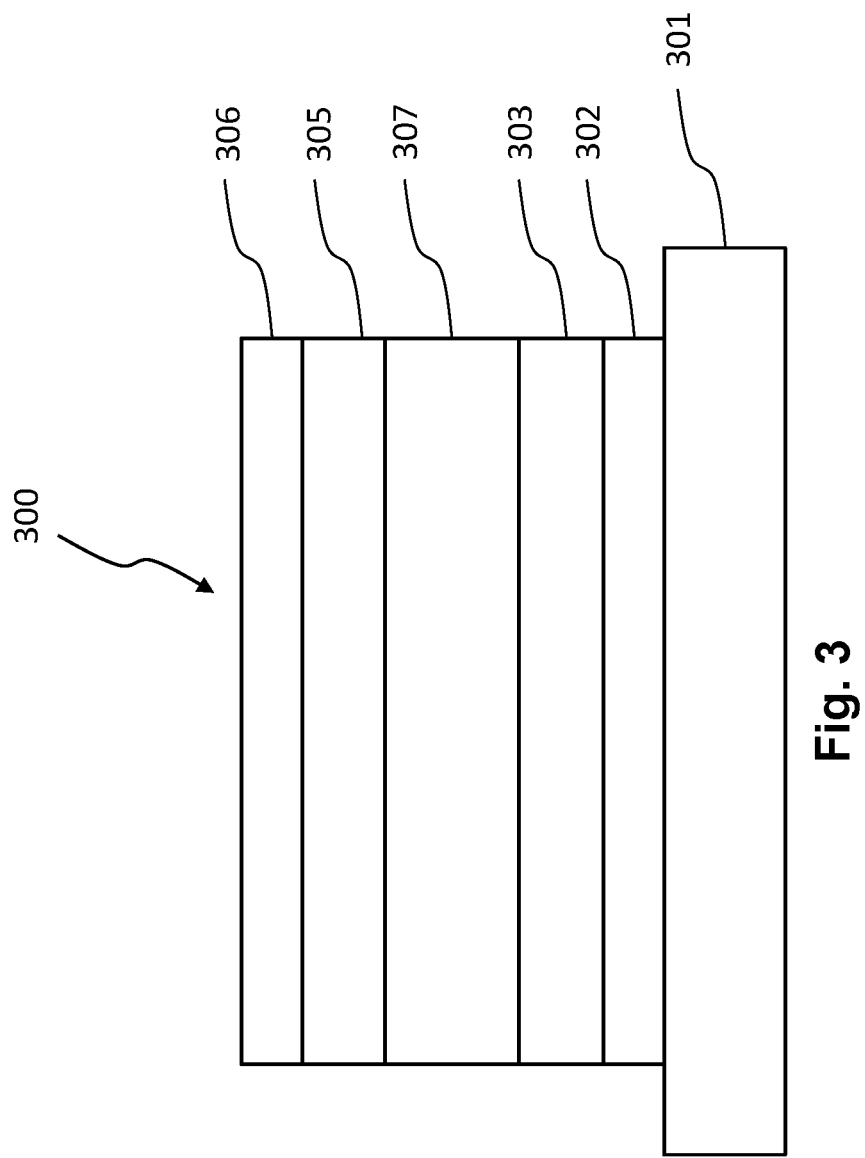
FIG. 3 is a drawing depicting a cross-section of a QD-LED structure in accordance with embodiments of the present application.

FIG. 3 is a drawing depicting a cross-section of a QD-LED light-emitting device structure 300 in accordance with embodiments of the present application. As illustrated in FIG. 3, the light emitting device 300 includes a substrate 301, a first electrode 302, an optional one or more first charge transport layers 303, an optional one or more second charge transport layers 305, and a second electrode 306. Such layers may be configured and composed comparably as analogous layers of the conventional configuration of FIG. 2. In embodiments of the present application, in contrast to the conventional configuration, the light-emitting device 300 includes a combined charge transport and emissive layer (CCTEL) 307, which as further detailed below combines properties of a charge transport layer and an emissive layer.

The substrate 301 may be made from any suitable material(s) as are typically used in light-emitting devices, such as glass substrates and polymer substrates. More specific examples of substrate materials include polyimides, polyethenes, polyethylenes, polyesters, polycarbonates, polyethersulfones, polypropylenes, and/or polyether ether ketones. The substrate 301 may be any suitable shape and size. In some embodiments, the dimensions of the substrate allow for more than one light-emitting device to be provided thereon. In an example, a major surface of the substrate may provide an area for multiple light-emitting devices to be formed as sub-pixels of a pixel, with each sub-pixel emitting light of a different wavelength such as red, green, and blue. In another example, a major surface of the substrate may provide an area for multiple pixels to be formed thereon, each pixel including a sub-pixel arrangement of multiple light-emitting devices.

The electrodes 302 and 306 may be made from any suitable material(s) as are typically used in light-emitting devices. At least one of the electrodes is a transparent or semi-transparent electrode for light emission, and the other of the electrodes is a reflective electrode to reflect any internal light toward the light-emitting side of the device. In the case of a bottom-emitting device, the first electrode 302 will be transparent or semi-transparent. Typical materials for the transparent or semi-transparent electrode include indium-doped tin oxide (ITO), fluorine doped tin oxide (FTO) or indium-doped zinc oxide (IZO), aluminum-doped zinc-oxide (AZO), indium-doped cadmium-oxide, and the like. In the case of a top-emitting device, the first electrode 302 may be made of any suitable reflective metal such as silver. In bottom-emitting devices, the second electrode 306 is a reflective electrode. Typical materials used for the reflective electrode include metals such as aluminium or silver (cathodes for a conventional structure) and gold or platinum (anodes for an inverted structure). Top-emitting structures will use a semi-transparent second electrode 306 such as thin (<20 nm) silver, or a magnesium-silver alloy. The electrodes 302, 306 may also be provided in any suitable arrangement. As an example, the electrodes 302, 306 may address a thin-film transistor (TFT) circuit.

As further detailed below, an aspect of the invention is a light-emitting device that includes a combined charge transport and emissive layer (CCTEL). In exemplary embodiments, the light-emitting device includes an anode, a cathode, and a CCTEL disposed between the anode and the cathode, the CCTEL comprising a crosslinked charge transport material and quantum dots. The quantum dots are distributed unevenly within the crosslinked charge transport material. For example, the quantum dots may be segregated from the crosslinked charge transport material whereby the quantum dots are located in a half portion of the CCTEL closest to the cathode, and in particular may form a layer or monolayer of quantum dots at least partially within the CCTEL at or adjacent to an outer surface of the CCTEL closest to the cathode. As another example, the quantum dots may be segregated from the crosslinked charge transport material whereby the quantum dots are located in a half portion of the CCTEL closest to the anode, and in particular may form a layer or monolayer of quantum dots at least partially within the CCTEL at or adjacent to an outer surface of the CCTEL closest to the anode. The quantum dots may phase separate from the crosslinked material at least in part during the deposition process as the solvent in the mixture containing the quantum dots and the cross-linkable material evaporates. Additionally or alternatively, the quantum dots may phase separate from the crosslinked material at least in part in response to the activation stimulus, such as in response to exposure to UV light. Accordingly, the precise timing and nature of the segregation or phase separation may vary depending on circumstances.

Referring to the figures, the CCTEL 307 includes a charge transport material and emissive quantum dots in which holes and electrons recombine to emit light. The charge transport material is chemically cross-linked. In exemplary embodiments, the quantum dots are distributed unevenly throughout the charge transport material of the CCTEL 307. FIGS. 4A-4E2 are drawings depicting cross-sections of an exemplary combined charge transport and emissive layer (CCTEL) 307 from FIG. 3 in accordance with embodiments of the present application, illustrating variations of uneven quantum dot distribution within the CCTEL. In each of such embodiments, the CCTEL 307 may be deposited on an underlayer 403 as shown in FIGS. 4A-4E2. In each of FIGS. 4A-4E2, quantum dots 401 are disposed within a cross-linked charge transport material 402. As referenced above, the quantum dot distribution within the cross-linked charge transport material is uneven, which may provide enhanced light-emitting efficiency in certain applications. The distribution of the quantum dots 401 within the cross-linked charge transport material 402 may be varied as follows as may be suitable for any particular application.

FIG. 4A illustrates an example CCTEL 307 in which the quantum dots 401 are distributed in clusters that are surrounded by the cross-linked charge transport material 402, rather than being individually dispersed within the cross-linked charge transport material. FIG. 4B illustrates an example CCTEL 307 in which the quantum dots 401 are distributed predominately in the upper half portion of the CCTEL, i.e. in the half of the CCTEL layer thickness that is farthest from the underlayer 403. FIG. 4C illustrates an example CCTEL 307 in which the quantum dots 401 are distributed at least partially within the CCTEL primarily at or adjacent to the upper outer surface of the CCTEL, i.e. the surface farthest from the underlayer 403. In a variation shown in FIG. 4C2, in a preferred embodiment the quantum dots 401 may form a monolayer (i.e., a single layer) located at least partially within the CCTEL at or adjacent to said upper outer surface of the CCTEL. The formation of a monolayer may be controlled or determined by setting a ratio of QDs in the initial solution to be of an amount or proportion suitable for the QDs to be limited to forming only a single layer. FIG. 4D illustrates an example CCTEL 307 in which the quantum dots 401 are distributed predominately in the lower half portion of the CCTEL, i.e. in the half of the CCTEL layer thickness that is closest to the underlayer 403. FIG. 4E illustrates an example CCTEL 307 in which the quantum dots 401 are distributed at least partially within the CCTEL primarily at or adjacent to the lower outer surface of the CCTEL, i.e. the surface which forms an interface with the underlayer 403. In a variation shown in FIG. 4E2, in a preferred embodiment the quantum dots 401 may form a monolayer located at least partially within the CCTEL at or adjacent to said lower outer surface of the CCTEL. The distribution of the quantum dots in the CCTEL may be obtained by phase separation during a process used to deposit the CCTEL layers, as further detailed in connection with the description below of a suitable fabrication method.

Referring again to the layered device structure depicted in FIG. 3 in combination with the CCTEL structures of FIGS. 4A-4E2, an example of a light emitting device 300 is configured as a conventional structure (i.e., the first electrode 302 is the anode and the second electrode 306 is the cathode) with a CCTEL 307 having hole transporting properties. Such a device including a CCTEL may be configured as follows: a substrate 301; a first electrode 302 which is an anode; an optional one or more first charge transport layers 303 which are hole transport layers; a CCTEL 307 in which the charge transport material is a hole transport material and the quantum dots are distributed as illustrated in FIG. 4B or FIG. 4C or 4C2; one or more second charge transport layers 305 which are electron transport layers; and a second electrode 306 which is a cathode.

The one or more first charge transport layers 303 are optional because the charge transport material in the CCTEL has hole transporting properties in this example. Advantageously, therefore, fewer or no first charge transport layers 303 may be used, and thus the number of layers required during fabrication of the device may be reduced. Furthermore, the number of interfaces between separately-deposited layers is fewer, which can reduce deficiencies in the performance of the light emitting device that are associated with defects (e.g. impurities, traps) at interfaces between separately deposited layers. Furthermore, the interface between the charge transport material of the CCTEL and the quantum dots may have very high quality (i.e. fewer defects, impurities, traps) such that transport of holes through the charge transport material and into a quantum dot may occur with high efficiency, thereby obviating the need for additional charge (hole) transport layers 303.

A CCTEL 307 in which the quantum dots are distributed as depicted in FIG. 4C or 4C2 (i.e. in which the quantum dots 401 are distributed primarily at the upper surface of the CCTEL which subsequently is an interface with an electron transport layer) has an advantage in that the quantum dots 401 are at an optimal position to receive holes transported through the charge transport material of the CCTEL 307 and electrons transported through the second charge transport layer 305. In this manner, injection of both electrons and holes into the quantum dots is effective, and therefore electroluminescence from the quantum dots may occur with higher efficiency and for low applied voltage difference between the cathode and anode as compared to alternative configurations. Efficiency is further enhanced when the quantum dots form a monolayer as shown in FIG. 4C2.

Another example of a light emitting device 300 is configured as a conventional structure (i.e., the first electrode 302 is the anode and the second electrode 306 is the cathode) with a CCTEL having electron transporting properties. Such a device including a CCTEL may be configured as follows: a substrate 301; a first electrode 302 which is an anode; one or more first charge transport layers 303 which are hole transport layers; a CCTEL 307 in which the charge transport material is an electron transport material and the quantum dots are distributed as depicted in FIG. 4D or FIG. 4E or 4E2; optionally one or more second charge transport layers 305 which are electrode transport layers; and a second electrode 306 which is a cathode.

The one or more second charge transport layers 305 are optional because the charge transport material in the CCTEL has electron transporting properties. Advantageously, therefore, fewer or no second charge transport layers 305 may be used, and thus the number of layers required during fabrication of the device may be reduced. Furthermore, the number of interfaces between different layers is reduced, which can reduce deficiencies in the performance of the light emitting device that are associated with defects (e.g. impurities, traps) at interfaces between separately deposited layers. Furthermore, the interface between the charge transport material of the CCTEL and the quantum dots may have very high quality (i.e. fewer defects, impurities, traps) such that transport of electrons from the charge transport material into a quantum dot may occur with high efficiency, thereby obviating the need for additional charge (electron) transport layers 305.

A CCTEL 307 in which the quantum dots are distributed as in FIG. 4E or 4E2 (i.e. in which the quantum dots 401 are distributed primarily at the lower surface of the CCTEL that subsequently is an interface with a hole transport layer) has an advantage in that the quantum dots are at an optimal position to receive electrons transported through the charge transport material of the CCTEL 307 and holes transported through the first charge transport layer 303. In this manner, injection of both electrons and holes into the quantum dots is effective, and therefore electroluminescence from the quantum dots may occur with high efficiency and for low applied voltage difference between the cathode and anode. Efficiency is further enhanced when the quantum dots form a monolayer as shown in FIG. 4E2.

Another example of a light emitting device 300 is configured as an inverted conventional structure (i.e., the first electrode 302 is the cathode and the second electrode 306 is the anode) with a CCTEL having electron transporting properties. Such a device including a CCTEL may be configured as follows: a substrate 301; a first electrode 302 which is a cathode; an optional one or more first charge transport layers 303 which are electrons transport layers; a CCTEL 307 in which the charge transport material is an electron transport material and the quantum dots are distributed as in FIG. 4B or FIG. 4C or 4C2; one or more second charge transport layers 305 which are hole transport layers; and a second electrode 306 which is an anode.

The one or more first charge transport layers 303 are optional because the charge transport material in the CCTEL 307 has electron transporting properties. Advantageously, therefore, fewer or no first charge transport layers 303 may be used, and thus the number of layers required during fabrication of the device may be reduced. Furthermore, the number of interfaces between different layers is reduced which can reduce deficiencies in the performance of the light emitting device that are associated with defects (e.g. impurities, traps) at interfaces between separately deposited layers. Furthermore, the interface between the charge transport material of the CCTEL and the quantum dots may have very high quality (i.e. fewer defects, impurities, traps) such that transport of electrons from the charge transport material into a quantum dot may occur with high efficiency, thereby obviating the need for additional charge (electron) transport layers 303.

A CCTEL 307 in which the quantum dots are distributed as in FIG. 4C or 4C2 (i.e. in which the quantum dots 401 are distributed primarily at the upper surface of the CCTEL that subsequently is an interface with a hole transport layer) has an advantage in that the quantum dots are at an optimal position to receive electrons transported through the charge transport material of the CCTEL 307 and holes transported through the second charge transport layer 305. In this manner, injection of both electrons and holes into the quantum dots is effective, and therefore electroluminescence from the quantum dots may occur with high efficiency and for low applied voltage difference between the cathode and anode. Again, efficiency is further enhanced when the quantum dots form a monolayer as shown in FIG. 4C2.

Another example of a light emitting device 300 is configured as an inverted structure (i.e., the first electrode 302 is the cathode and the second electrode 306 is the anode) with a CCTEL having hole transporting properties. Such a device including a CCTEL may be configured as follows: a substrate 301; a first electrode 302 which is a cathode; one or more first charge transport layers 303 which are electron transport layers; a CCTEL 307 in which the charge transport material is a hole transport material and the quantum dots are distributed as in FIG. 4D or FIG. 4E or 4E2; optionally one or more second charge transport layers 305 which are hole transport layers; and a second electrode 306 which is an anode.

The one or more second charge transport layers 305 are optional because the charge transport material in the CCTEL 307 has hole transporting properties. Advantageously, therefore, fewer or no second charge transport layers 305 may be used, and thus the number of layers required during fabrication of the device may be reduced. Furthermore, the number of interfaces between different layers is reduced, which can reduce deficiencies in the performance of the light emitting device that are associated with defects (e.g. impurities, traps) at interfaces between separately deposited layers. Furthermore, the interface between the charge transport material of the CCTEL and the quantum dots may have very high quality (i.e. fewer defects, impurities, traps) such that transport of holes from the charge transport material into a quantum dot may occur with high efficiency, thereby obviating the need for additional charge (hole) transport layers 305.

A CCTEL 307 in which the quantum dots are distributed as in FIG. 4E or 4E2 (i.e. in which the quantum dots 401 are distributed primarily at the lower surface of the CCTEL that subsequently is an interface with an electron transport layer) has an advantage in that the quantum dots are at an optimal position to receive holes transported through the charge transport material of the CCTEL 307 and electrons transported through the first charge transport layer 303. In this manner, injection of both electrons and holes into the quantum dots is effective, and therefore electroluminescence from the quantum dots may occur with high efficiency and for low applied voltage difference between the cathode and anode. Again, efficiency is further enhanced when the quantum dots form a monolayer as shown in FIG. 4C2.

The following describes fabrication methods that may be employed in connection with fabricating the described light-emitting devices configured in accordance with embodiments of the present application. The fabrication methods are described principally in connection with a QLED example having a "conventional structure" (again, in which the first electrode 302 is an anode and the second electrode 306 is a cathode). Comparable principles may be applicable to other device examples described in this application.

To deposit multiple layers in a typical QLED structure using solution process methods, solution of different materials in adjacent orthogonal solvents should be deposited. Solution process methods include, but are not limited to, methods of drop casting, spin coating, dip coating, slot die coating, and inkjet printing. The methods of the current application include methods to fabricate the light emitting device 300 particularly including formation of a CCTEL 307 using only one solution processed deposition step.

A mixture including a cross-linkable charge transporting material and QDs in a solvent can be deposited to create the CCTEL in one step, resulting in a charge transporting portion (the cross-linkable charge transporting material) and an emissive portion (QDs) deeply interconnected and linked without a heterogeneous interface. The two materials initially are randomly distributed in the deposited layer, and during the fabrication process, the materials segregate (separate) into two different phases, for example creating a defined two layered structure such as depicted in FIG. 4C or 4C2 in which the quantum dots form a layer at an outer surface of the CCTEL farthest from the underlayer, or as depicted in FIG. 4E or 4E2 in which the quantum dots form a layer at an outer surface of the CCTEL closest to the underlayer. Such segregation or separation, for example, may occur due to different density, particle size, and/or interaction between the quantum dots and ligands versus the cross-linkable charge transport material. The quantum dots may segregate from the crosslinked material at least in part during the deposition process as the mixture solvent that includes the QDs evaporates. Additionally or alternatively, the quantum dots may segregate from the crosslinked material at least in part in response to the activation stimulus during the polymerization process, such as during exposure to UV light. Accordingly, the precise timing and nature of the segregation or phase separation may vary.

The interactions that lead to the phase separation or segregation may occur for one or more of a variety of reasons. The organic/QDs solution undergoes a transition from a homogeneous liquid mixture to a phase separated solid likely during spin-coating when most of the solvent evaporates. The phase separation is likely driven by the minimization of interface surface energies. Organic small molecules are preferentially deposited on the substrate because they are more polarizable then QDs and the organic small molecules have higher contact area with a flat surface which they can achieve. Furthermore, organic material slows down the evaporation of the solvent, allowing more time for the QDs to reach equilibrium on the surface. Once phase separation has occurred, QDs are mobile on the organic charge transporting material surface and self-assemble into arrays as the QDs seek their equilibrium conformation, coarsening via combination of Ostwald ripening (small particles tend to dissolve and redeposit into larger particles) and cluster diffusion, depending on the stage of coarsening and the initial QD concentration. Phase segregation is probably further enhanced when the CCTEL is crosslinked by the activation source (e.g., UV light exposure) and depending on when the polymerization is performed. Phase segregation can happen before solvents evaporate (during spin coating), after part of the solvents evaporate (after spin coating but before UV exposure or after spin coating but after UV exposure), or after all solvents evaporates (after thermal annealing).

Due to the nature of the cross-linkable charge transport material, two CCTELs can be patterned side-by-side on the substrate using activation of the polymerization via external energy stimuli such as pressure, light such as ultraviolet (UV) light, heat, and/or a change in pH. Such processes are described in Applicant's co-pending application entitled "Crosslinked Emissive Layer Containing Quantum Dots For Light-Emitting Device and Method For Making Same" (application Ser. No. 15/937,073 (the '073 Application) filed on Mar. 27, 2018), the contents of which are incorporated here by reference. In accordance with the methods of the '073 application, the total and relative cross-linkable material/QDs thickness of the two materials can be tuned in a single step by changing the total concentration of the mixture and the concentration ratio of the two materials in the mixture. The charge transporting material can have hole or electron transporting, injecting or blocking properties, or can simultaneously have both hole and electron transporting properties.

Figure 5A:
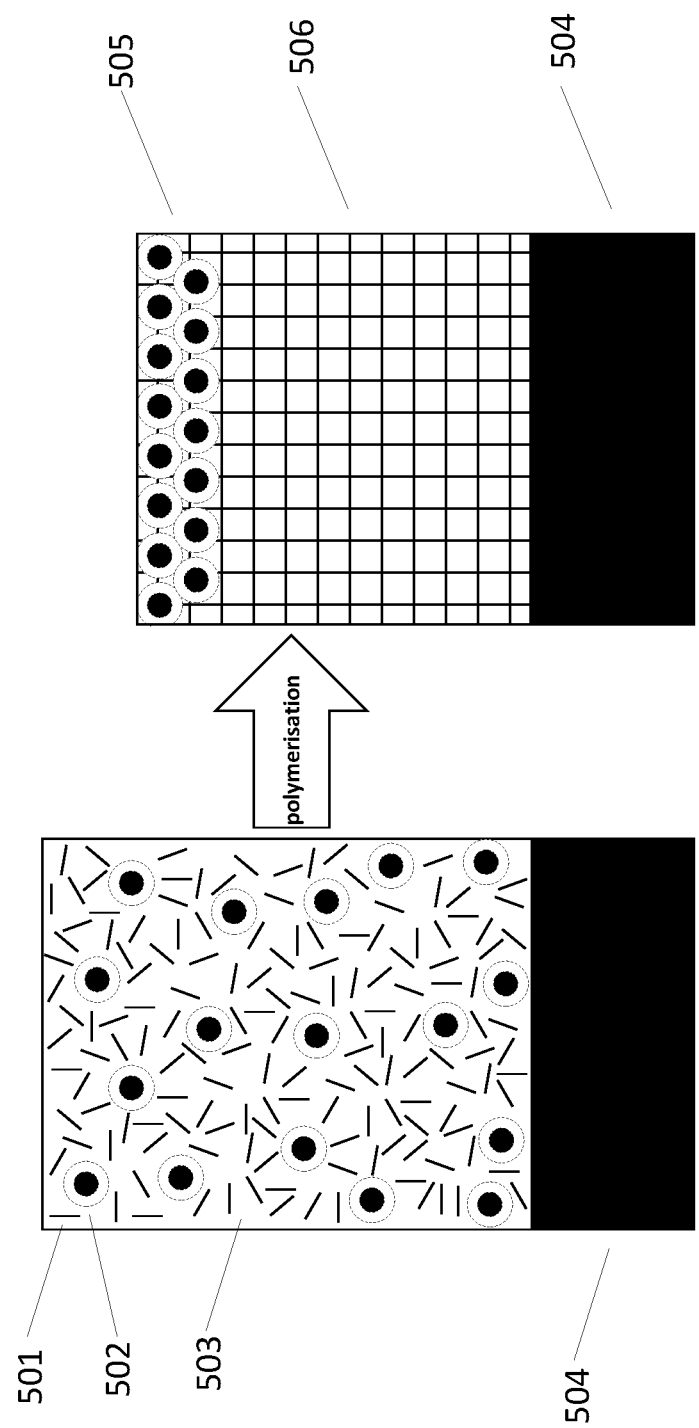
FIG. 5A and FIG. 5B are drawings each depicting a transition from a mixture including a cross-linkable charge transporting material and QDs to a CCTEL in accordance with embodiments of the present application.
Figure 5B:
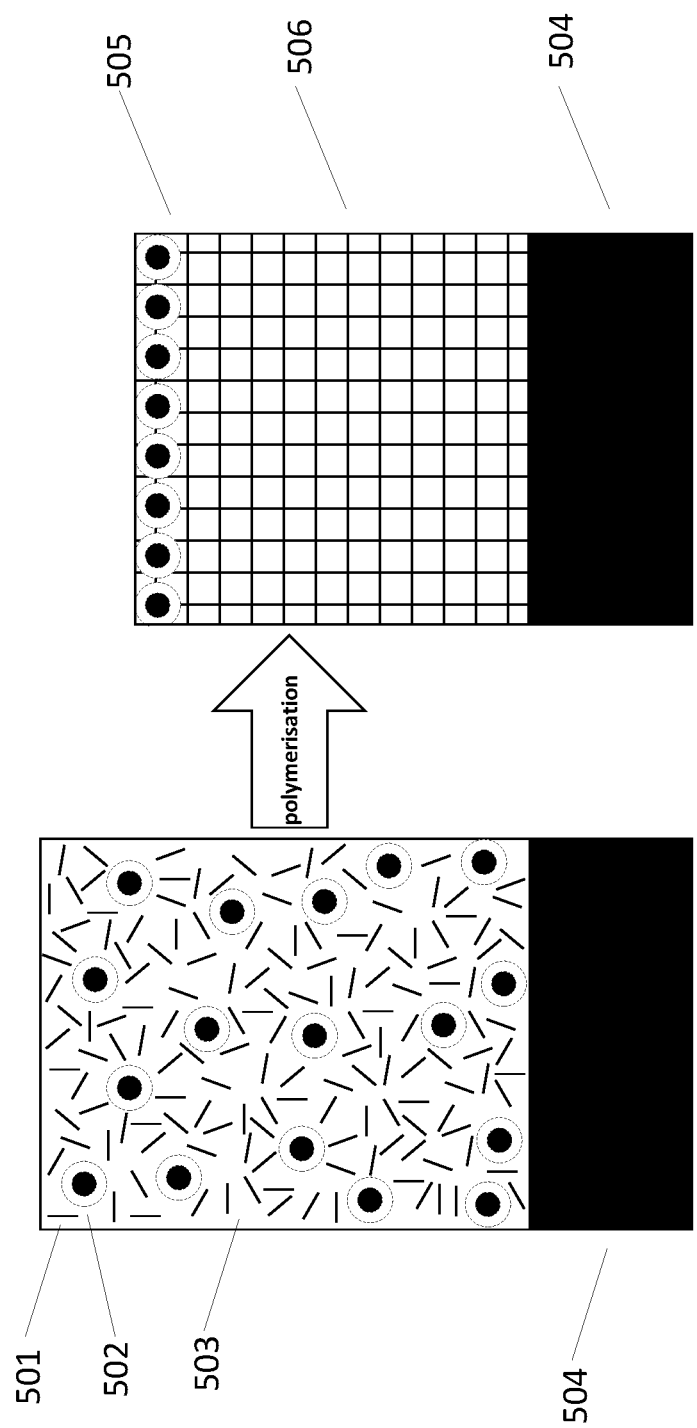

FIG. 5A is a drawing depicting a transition from a mixture including a cross-linkable charge transporting material and QDs to a CCTEL in accordance with embodiments of the present application. FIG. 5B is a drawing depicting a transition from a mixture including a cross-linkable charge transporting material and QDs to a CCTEL in accordance with embodiments of the present application, in which a monolayer of QDs is formed as referenced above. Referring to such figures, a mixture of a cross-linkable material 501 and QDs 502 in a solvent 503 is deposited on top of a substrate (or other layer in a QD-LED structure such as an electrode or CTL) 504 using any suitable process method. During deposition, phase segregation may occur as the solvent evaporates to form a layer of QDs 505 located adjacent to or toward an outer surface (e.g., top surface in the figure orientation) of the crosslinked material 506, which corresponds to the example CCTEL configuration of FIG. 4C (FIG. 5A) or 4C2 (FIG. 5B—QD monolayer). An external energy stimulus activates polymerization of the cross-linkable material, which further may promote such phase segregation, and/or maintains the phase separation fixed in place that may occur during the previous deposition process.

An unexpected advantage of this fabrication method is that the crosslinked material forms a matrix that makes the QD layer resistant to further solvent rinsing. In this way a patterned QD-LED device can be fabricated using UV light with a similar approach to the one described in the Method A of the '073 application referenced above. As compared with the methods described in the '073 application, in embodiments of the present application the QDs segregate to an outer surface layer 505 of the crosslinked layer 506 during polymerization. Using such approach, different subpixels (e.g., R, G and B) can be patterned on the same substrate by sequential application of the fabrication method, thereby delineating the areas where the materials that constitute the QLED subpixel structures are deposited.

Exemplary UV-induced crosslinked charge transport materials include UV-induced crosslinked hole transport materials and/or UV-induced crosslinked electron transport materials. Accordingly, the matrix of one or more UV-induced crosslinked charge transport materials may be formed from one or more types of cross-linkable materials. Such materials may include one or more hole transport materials and/or one or more electron transport materials. In some embodiments, the cross-linkable hole transport material may be a material which is an effective hole transporter both without and with crosslinking. In other embodiments, the cross-linkable hole transport material may be a material which is an effective hole transporter only when crosslinked. In some embodiments, the cross-linkable electron transport material may be a material which is an effective electron transporter both without and with crosslinking. In other embodiments, the cross-linkable electron transport material may be a material which is an effective electron transporter only when crosslinked. In some embodiments, the cross-linked charge transport materials can include one or more of hole injection materials, electron injection materials, hole blocking materials, electron blocking materials, ambipolar materials and/or interconnecting materials (ICM). A material is defined ambipolar when it has both hole and electron transporting properties.

In some embodiments, the cross-linkable material from which the UV-induced crosslinked charge transport material may be formed includes at least two moieties with different characteristics. As an example, one of the at least two moieties of the molecule may provide charge transporting properties and another of the at least two moieties of the molecule may provide UV-cross-linking capabilities. Exemplary moieties that may provide charge transporting properties include, but are not limited to, tertiary, secondary, and primary aromatic or aliphatic amines, heterocyclic amines, tryaryl phosphines, and quinolinolates. Exemplary moieties that may provide UV-cross-linking capabilities include, but are not limited to, oxetane, epoxy, thiol, alkene, alkyne, ketone, and aldehyde units. In some implementations, the two moieties may be connected and between them there may be a distance of less than 20 nm.

In some embodiments the mixture of the cross-linkable material with the QDs can include a small molecule co-monomer that can allow polymerization. The co-monomer may contain at least one functional group X that may interact with a functional group Y of the cross-linkable material. The cross-linkable material may include such functional group Y at two or more molecular sites. For example, the functional group X may be at two ends of the co-monomer; the functional groups Y may be at two ends of the cross-linkable material. In one implementation, the functional groups X may be a thiol, and the function groups Y may be an alkene or alkyne, or vice versa.

Ligands of the QDs, co-monomers and cross-linkable materials included in the mixture can be selected to create uniform dispersion in the deposition solvent. Materials with similar polarity indexes can be selected to ensure homogeneity of the deposited mixtures.

One example of a cross-linkable material from which the structure described above may be formed is N4,N4'-Bis(4-(6-((3-ethyloxetan-3-yl)methoxy)hexyl)phenyl)-N4,N4'-diphenylbiphenyl-4,4'-diamine (OTPD), shown below in Formula 1. In some embodiments, the cross-linkable material shown in Formula 1 may be used in forming the matrix shown in FIGS. 5A and 5B.

Formula 1

Another example of a cross-linkable material from which the structure described above may be formed is N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), shown below in Formula 2. In some embodiments, the cross-linkable material shown in Formula 2 may be used in forming the matrix shown in FIGS. 5A and 5B.

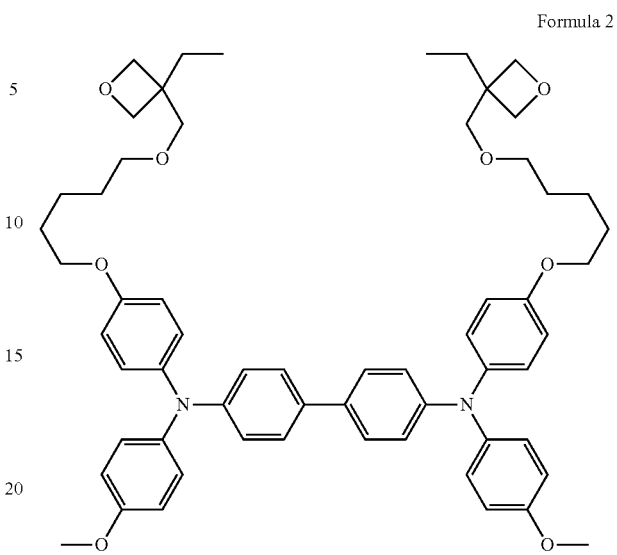

Formula 2

Another example of a cross-linkable material from which the structure described above may be formed is N, N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC), shown below in Formula 3. In some embodiments, the cross-linkable material shown in Formula 3 may be used in forming the matrix shown in FIGS. 5A and 5B.

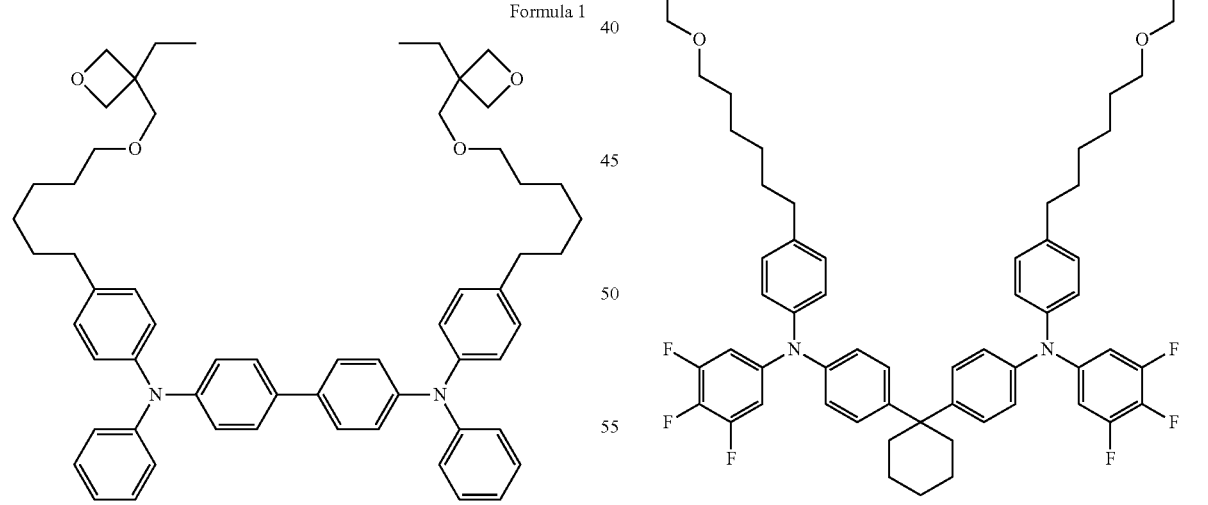

Formula 3

An example of a cross-linkable material from which the structure described above may be formed is N4,N4'-Di(naphthalen-1-yl)-N4,N4'-bis(4-vinylphenyl)biphenyl-4,4'-diamine (VNPB), shown below in Formula 4. In some embodiments, the cross-linkable material shown in Formula 4 may be used in forming the matrix shown in FIGS. 5A and 5B.

Formula 4

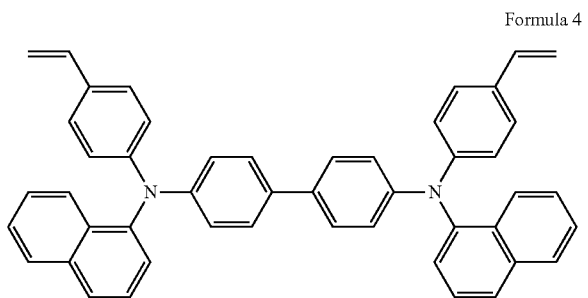 [SMILES: C=Cc1ccc(N(c2ccc(-c3ccc(N(c4ccc(C=C)cc4)c4cccc5ccccc45)cc3)cc2)c2cccc3ccccc23)cc1]

Another example of a cross-linkable material from which the structure described above may be formed is 9,9-Bis[4-[(4-ethenylphenyl)methoxy]phenyl]-N2,N7-di-1-naphthalenyl-N2,N7-diphenyl-9H-Fluorene-2,7-diamine (VB-FNPD), shown below in Formula 5. In some embodiments, the cross-linkable material shown in Formula 5 may be used in forming the matrix shown in FIGS. 5A and 5B.

Formula 5

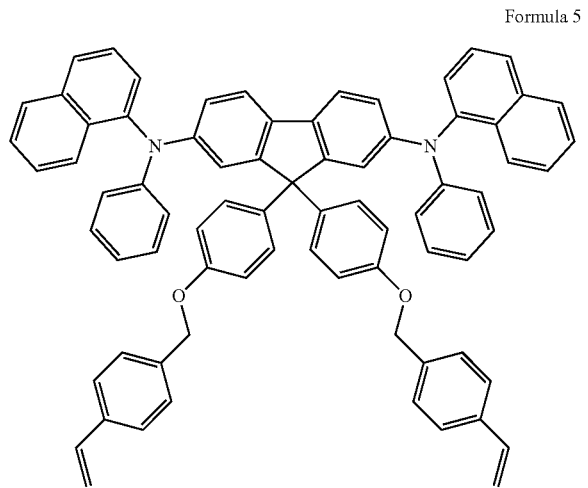 [SMILES: C=Cc1ccc(COc2ccc(C3(c4ccc(OCc5ccc(C=C)cc5)cc4)c4cc(N(c5ccccc5)c5cccc6ccccc56)ccc4-c4ccc(N(c5ccccc5)c5cccc6ccccc56)cc43)cc2)cc1]

In some embodiments the emissive layer is formed using one or more photo-initiators. As such, the emissive layer may include one or more photo-initiators. A photo initiator is a material that initiates polymerization in response to light stimuli. In some embodiments, the photo initiator may generate one or more radicals, ions, acids, and/or species that may initiate such polymerization.

Embodiments of the present application provide significant unexpected advantages over conventional configurations. Crosslinked material and QDs are deeply interconnected and linked between each other, resulting in improved charge transport from the charge transport material into a quantum dot. Time for fabrication of QD-LEDs also is shorter. As referenced above, combining charge transport material with QDs into a combined layer of a CCTEL further reduces the number of layers required in the device structure, which in turn can reduce deficiencies in performance that otherwise may occur due to effects of the layer interfaces.

In contrast to conventional processes and structures, such as for example relative to the Coe-Sullivan articles referenced in the background section above, embodiments of the present application use a polymerizable organic host material with specific features including at least one polymerizable functional group and at least one charge transporting moiety. In some embodiments a photoinitiator (or initiator in general) is included. The QDs can phase segregate in one of opposing portions of the CCTEL, or in intermediate positions. Conventional methods do not use any patterning of the structure. The polymerization of the CCTEL makes the layer solvent resistant, and there may be specific interactions between the charge transport material and the QDs that render the structure particularly advantageous as compared to conventional configurations. Packing of the QDs can be directed or guided by polymerization such that a specific morphology or structure can be achieved. The QDs occupy specific positions in the CCTEL in that alternative positions are blocked because the charge transport material links the QDs. Deposition of an additional layer on top makes the QDs less susceptible to relocation within the layer or partial rinsing from the solvent being used. Accordingly, more solvent compositions can be used to deposit layers on top of the CCTEL, so long as a solvent is orthogonal to the CCTEL that is crosslinked, and thus more resistant to solvent rinsing, rather than being orthogonal only to the QDs and easier to wash away.

During the polymerization process the QDs' ligands can be replaced or partially replaced with charge transport material, or the charge transport material can act as a co-ligand to improve defect passivation of QDs. The QDs in the CCTEL are partially covered by the charge transport material, and this can have various advantages. For example, the hole and electron transport materials are partially contacting. Hole transport is more facilitated than electron transport in the QDs because the electron transport material has higher mobility than hole transport material. To have better hole/electron balance at the QDs, higher mobility for the hole transport material is needed. The QDs are further protected from external contaminations (moisture, oxygen, UV) that can cause degradation, providing longer lifetimes of the resultant devices.

Additional specific examples and variations include the following. In an exemplary embodiment, a mixture of a UV cross-linkable charge transporting material and QDs is provided in an organic solvent. The mixture is deposited with a solution processable method on top of a substrate. A specific area of the deposited layer is exposed to UV light. The cross-linkable material polymerizes, and the mixture becomes insoluble in the UV exposed area and the remaining materials are washed away with a solvent. During this process phase separation between the cross-linkable material and the QDs occurs to form the CCTEL structure. The process and the final structure are schematized in FIGS. 5A and 5B, wherein the QDs' resultant position is to form a QD layer 505 on an outer surface (e.g. top) of the layer of the crosslinked material 506 thus forming a matrix that keeps the QDs in place.

The solvent 503 may be any suitable solvent. For example, the solvent may be selected such that the quantum dots (and photo initiator, if included) are soluble therein. Exemplary solvents include, but are not limited to, the following or mixtures including the following: acetone, dichloromethane, chloroform, linear or branched alkyl acetates (e.g. ethyl acetate, n-butyl acetate, 2-butyl acetate), linear or branched alkanes with 3 to 30 atoms of carbon (e.g., pentane, hexane, heptane, octane, nonane, decane, undecane, dodecane), linear or branched alcohols with 1 to 20 atoms of carbon (e.g., butanol, 2-propanol, propanol, ethanol, methanol), linear or branched alkoxy alcohols with 2 to 20 atoms of carbon (e.g., 2-Methoxyethanol, 2-Ethoxyethanol), mono, di and tri halogen substituted benzenes (e.g., chlorobenzene, 1,2-dibromobenzene, 1,3-dibromobenzene, 1,4-dibromobenzene, 1,3,5-tribromobenzene, 1,2,4-tribromobenzene), linear or branched ethers with 2 to 20 atoms of carbon, and/or mono, di and tri alkyl substituted benzenes (e.g., toluene, 1,2-Dimethylbenzene, 1,3-Dimethylbenzene, 1,4-Dimethylbenzene), benzene, dioxane, propylene glycol monomethyl ether acetate (PGMEA), 1-methoxy-2-propanol. The particular solvent that is utilized may depend on the specific quantum dots, cross-linkable material, and photo initiator that are selected. QDs, ligands of the QDs, and cross-linkable material can be selected to create uniform dispersion in the deposition solvent. Materials with similar polarity indexes can be selected to ensure homogeneity of the deposited mixtures.

Another exemplary embodiment is similar to the previous embodiment, with the addition of a photo initiator in the mixture. Example photo initiators include sulfonium- and iodonium-salts (e.g. triphenylsulfonium triflate, diphenyliodonium triflate, iodonium, [4-(octyloxy)phenyl]phenyl hexafluorophosphate, bis(4-methylphenyl)iodonium hexafluorophosphate, diphenyliodonium hexafluoroarsenate, diphenyliodonium hexafluoroantimonate, etc), chromophores containing the benzoyl group (benzoin ether derivatives, halogenated ketones, dialkoxyacetophenones, diphenylacetophenones, etc), hydroxy alkyl heterocyclic or conjugated ketones, benzophenone- and thioxanthone-moiety-based cleavable systems (such as benzophenone phenyl sulfides, ketosulfoxides, etc), benzoyl phosphine oxide derivatives, phosphine oxide derivatives, trichloromethyl triazines, biradical-generating ketones, peroxides, diketones, azides and aromatic bis-azides, azo derivatives, disulfide derivatives, disilane derivatives, diselenide and diphenylditelluride derivatives, digermane and distannane derivatives, peresters, barton's ester derivatives, hydroxamic and thiohydroxamic acids and esters, organoborates, titanocenes, chromium complexes, aluminate complexes, tempo-based alkoxyamines, oxyamines, alkoxyamines, and silyloxyamines.

In this embodiment, when the specific area of the deposited layer is exposed to UV light, the photo initiator initiates the polymerization of the cross-linkable material. QDs, ligands of the QDs, cross-linkable material, and photoinitiator can be selected to create uniform dispersion in the deposition solvent. Materials with similar polarity indexes can be selected to ensure homogeneity of the deposited mixtures.

FIGS. 6A-6E are drawings depicting a progression of steps constituting an exemplary method of fabricating a light-emitting device in accordance with embodiments of the present application. As referenced above, the fabrication method is described principally in connection with a QLED example having a conventional structure (again, in which the first electrode 302 is an anode and the second electrode 306 is a cathode). Comparable principles may be applicable to other device examples described in this application. In this exemplary method, a phase separated crosslinked emissive layer (or at least a portion thereof) is produced. In this embodiment, the emissive layer may be patterned by UV-exposing the desired area of the deposited layer. The patterned emissive layer may then be insoluble in the UV-exposed area, and the remaining materials may be removed, such as by being washed away with a solvent.

Referring to the progression of FIGS. 6A-6E, as shown in FIG. 6A, at an initial step a substrate or comparable base layer 601 is provided. As shown in FIG. 6B, a first electrode 602 is deposited on the substrate 601, and thus the base layer further may include an electrode. Additional charge transport layers may be deposited on the electrode and other base layers as described above with respect to other embodiments. The base layer, therefore, further may include a hole transport layer having a cross-linkable hole transport material and the activation stimulus crosslinks the hole transport layer with the first portion of the CCTEL, or an electron transport layer having a cross-linkable electron transport material, and the activation stimulus crosslinks the electron transport layer with the first portion of the CCTEL. The electrode 602 (or other base layer component) may be deposited on the substrate 601 using any suitable method as are known in the art. Example deposition methods include sputtering, evaporative coating, printing, chemical vapor deposition, and the like. As described above, the deposited electrode may be provided in any suitable form, and one exemplary implementation is an electrode for a TFT circuit. As shown in FIG. 6C, a mixture 603 including a cross-linkable material 605, quantum dots 606 and a solvent 604 is deposited on the first electrode 602 and the substrate 601. In some embodiments, the mixture 603 additionally includes photo initiator, as described above. Between steps depicted in FIG. 6C and FIG. 6D1/6D2, some of the solvent may evaporate.

As shown in FIGS. 6D1 and 6D2, ultraviolet (UV) light 608 then is applied through a mask 607 that provides a shape or pattern through which the desired area of the mixture 603 is exposed to the UV light 608. Exposure of the mixture 603 to the UV light results in the crosslinking of the cross-linkable material 605. In embodiments in which the mixture also includes a photo initiator, the photo initiator may assist in initializing the cross-linking of the cross-linkable material. As shown in FIG. 6E, the result of this process is a phase separated CCTEL layer 620, whereby the crosslinking of the cross-linkable material 605 results in phase separation of the QDs 606. In the variation of the process through FIG. 6D1 to 6E, the QDs tend to remain distributed within the cross-linkable material during the deposition process, with the UV exposure causing the gravamen of the phase separation. In the variation of the process through FIG. 6D2 to 6E, the QDs tend to phase separate during the deposition process as the solvent evaporates. The variations may occur to some degree in combination. In all such variations, the UV exposure polymerizes the crosslinked material, which fixes the phase separation that is depicted in the resultant FIG. 6E.

Accordingly, in the phase separated CCTEL layer 620, the QDs will become positioned within the CCTEL adjacent to or at an outer surface layer, e.g., the top surface layer, to form a quantum dot layer 609. The QDs will be immobilized within the quantum dot layer 609 from traveling throughout the formed crosslinked matrix 610 that is composed of the remainder of the crosslinked material 605. The phase separated CCTEL layer 620, therefore, is composed of a first portion 609 mainly composed of QDs, which may be a monolayer of QDs, which has emissive properties thus constituting an emissive portion of the CCTEL layer, and a second portion 610 mainly composed of the cross-linked material, which has charge transporting and/or injecting and/or blocking properties. Accordingly, the first portion also is referred to as the emissive portion 609 of the CCTEL 620, and the second portion may be referred to as the charge manipulation portion 610 of the CCTEL 620.

As further shown in FIG. 6E, the remaining mixture 603 that had been masked by the mask 607 of FIG. 6D1/6D2 (and thus not exposed to the UV light 608) may be washed away with a solvent, and the CCTEL combination 620 of the emissive portion 609 and the charge manipulation (charge transporting and/or injecting and/or blocking) portion 610 remains, as the CCTEL 620 is insoluble in the solvent following the UV exposure. In some embodiments, the solvent is the same solvent used in the mixture 603 that is deposited in FIG. 6C. In other embodiments, the solvent is a similar solvent or orthogonal solvent to the solvent used in the mixture 603 that is deposited in FIG. 6C. Accordingly, as shown in FIG. 6E, the combination of emissive portion 609 and charge manipulation portion 610 remains on the first electrode 602. The solvent used in the mixture 603 and/or the solvent used to wash away the remaining mixture may be evaporated during annealing (e.g., heating) of the deposited layer. The annealing may be performed at any suitable temperature that effectuates evaporation of the solvent while also maintaining the integrity of the quantum dots and charge transport material. In exemplary embodiments, annealing may be performed at a temperature ranging from 5° C. to 150° C., or at a temperature ranging from 30° C. to 150° C., or at a temperature ranging from 30° C. to 100° C.

In an exemplary embodiment, subsequent to the application of UV light as shown in FIG. 6D1/6D2, the layer may be annealed (e.g., heated) to facilitate evaporation and removal of the solvent(s). This annealing may be performed prior to the washing or subsequent to the washing. In implementations in which the annealing is performed prior to the washing, a subsequent annealing may be performed after washing. As another example, application of UV light as shown in FIG. 6D1/6D2 and annealing (e.g., heating) may be performed in parallel. This may remove the solvent used in the mixture 603. Subsequent to the washing, a subsequent annealing may be performed. As yet another example, annealing may be conducted prior to application of UV light as shown in FIG. 6D1/6D2, and subsequent to the washing, a subsequent annealing may be performed.

Factors such as the UV exposure times, UV-intensity, amount of photo initiator, a ratio between QDs and cross-linkable material, and total concentration of the mixture may allow for control of the morphology of the emissive material. For example, UV exposure time may range from 0.001 seconds to 15 minutes, and/or UV exposure intensity may range from 0.001 to 100,000 mJ/cm$^2$. The amount of photo initiator may range from 0.001 to 15 wt % of the total concentration of the mixture. The ratio between QDs and cross-linkable material may range from 0.001 to 1, and the total concentration of the mixture may range from 0.1 to 20 wt %. In an exemplary implementation, the UV exposure intensity ranges from 1 to 100 mJ/cm$^2$ at a UV exposure time of 0.01 to 200 seconds, the total concentration of the mixture ranges from 0.5 and 10 wt %, the ratio between QDs and cross-linkable material ranges from 0.1 and 1, and the photo initiator concentration ranges from 0.1 and 5 wt % of the total concentration of the mixture.

Using an approach such as that described above, different subpixels (e.g., R, G and B) can be patterned on a given substrate in a manner that delineates the areas in which the materials that constitute the QLED subpixel structures are deposited. Furthermore, in other exemplary embodiments, one or more activation stimuli in addition to or other than UV can be used. Examples include pressure, heat, a second exposure of light (this can be in the UV range or other ranges such as Visible or IR), and change in pH. Accordingly, in some embodiments, the method of producing the cross-linked emissive layer as described with respect to FIGS. 6A-6E may be modified, for example, with respect to the phase separation step shown in FIG. 6D1/6D2. For example, instead of the application of UV light as the activation stimulus, the crosslinking step may include instead or additionally one or more activation stimuli including the application of pressure, increase in temperature, and/or an addition to the mixture 603 to provide a change in pH. Application of any activation stimulus or combination thereof may provide for formation of the phase separated matrix that constitutes the CCTEL 620.

The following constitutes variations on the above methods, which further may be employed individually or in combination as may be suitable for any particular application. An exemplary embodiment may include an anode and cathode and layered CCTEL 307/620 as described above. In such embodiment, the cross-linkable material has hole injection/transporting properties and is adjacent to the anode. In another exemplary embodiment, the cross-linkable material has electron injection/transporting properties and is adjacent to the cathode. In another exemplary embodiment, there is one or more additional electron injection/transporting layers between the CCTEL 307/620 and the cathode. In another exemplary embodiment, there is one or more additional hole injection/transporting layers between the CCTEL 307/620 and the anode.

Materials examples include, but are not limited to, the following. The electron transport and/or electron injection layers may include individual or combinations of: ZnO, 8-quinolinolato lithium (Liq.), LiF, $Cs_2CO_3$, $Mg_xZn_{1-x}O$, $Al_xZn_{1-x}O$, 2,2',2"-(1,3,5-benzinetriyl)-tris(1-phenyl-1-H-benzimidazole) (TPBi), $TiO_2$, $ZrO_2$, N4,N4'-Di(naphthalen-1-yl)-N4,N4'-bis(4-vinylphenyl)biphenyl-4,4'-diamine (VNPB), 9,9-Bis[4-[(4-ethenylphenyl)methoxy]phenyl]-N2,N7-di-1-naphthalenyl-N2,N7-diphenyl-9H-Fluorene-2,7-diamine (VB-FNPD), where $0 \leq x \leq 1$. The EML my include: QD nanoparticles which include one or more of: InP, CdSe, CdS, $CdSe_xS_{1-x}$, CdTe, $Cd_xZn_{1-x}Se$, $Cd_xZn_{1-x}Se_yS_{1-y}$, ZnSe, ZnS, ZnSTe, ZnSeTe, perovskites of the form $ABX_3$, $Zn_wCuZnIn_{1-(w-z)}S$, carbon, where $0 \leq w, x, y, z \leq 1$ and $(w+z) \leq 1$. The hole transport and/or hole injection layers may include individual or combinations of: poly(3,4-ethylenedioxythiophene):poly(styrenesulfonate) (PEDOT:PSS), poly(9,9-dioctylfluorene-co-N-(4-sec-butylphenyl)-diphenylamine) (TFB), poly(9-vinylcarbazole) (PVK), poly(N, N'-bis(4-butylphenyl)-N, N'-bisphenylbenzidine) (PolyTPD), $V_2O_5$, NiO, CuO, $WO_3$, $MoO_3$, 2,3,5,6-tetrafluoro-7,7,8,8-tetracyanoquinodimethane (F4TCNQ), 1,4,5,8,9,11-hexaazatriphenylenehexacarbonitrile (HATCN), N4,N4'-Bis(4-(6-((3-ethyloxetan-3-yl)methoxy)hexyl)phenyl)-N4,N4'-diphenylbiphenyl-4,4'-diamine (OTPD), N4,N4'-Bis(4-(6-((3-ethyloxetan-3-yl)methoxy)hexyloxy)phenyl)-N4,N4'-bis(4-methoxyphenyl)biphenyl-4,4'-diamine (QUPD), N,N'-(4,4'-(Cyclohexane-1,1-diyl)bis(4,1-phenylene))bis(N-(4-(6-(2-ethyloxetan-2-yloxy)hexyl)phenyl)-3,4,5-trifluoroaniline) (X-F6-TAPC).

The above-described methods are described as producing a single light-emitting device. It will be appreciated that the patterning of the mask may allow for producing multiple light-emitting devices to be formed in different regions of the substrate, an in particular may form an array of light-emitting devices. Furthermore, any of the above-described methods can be repeated to form light-emitting devices having different QDs, such as for example different QDs that emit different colors of light (e.g. R, G, B) in different regions of the substrate, as determined by the patterning of the mask. The arrangement of light-emitting devices may form sub-pixel arrangements and pixel arrangements of sub-pixels.

In exemplary embodiments, light-emitting devices may be arranged such that the light-emitting devices are separated at least in part by one or more insulating materials. This arrangement may also be referred to as a "bank structure." FIGS. 7A and 7B are drawings depicting a bank structure 700 of multiple light-emitting devices formed in accordance with embodiments of the present application, with FIG. 7A illustrating a cross-section view and FIG. 7B illustrating a top view. As shown in such figures, first and second subpixels 700A and 700B are patterned on the same substrate 708, and an insulating material 704 delineates the areas in which the materials that constitute the QLED subpixel structures of devices 700A and 700B are deposited. FIGS. 7A and 7B illustrate an exemplary arrangement of two light-emitting devices arranged as subpixels, although any suitable number of light-emitting devices may be deposited in such arrangement. The different subpixels may be configured to emit light of different colors. Exemplary insulating materials 704 may include, but are not limited to, polyimides.

In some examples, the insulating material may include a surface treatment, such as for example fluorine, to modify the insulating material wetting properties. For example, the insulating material may be made hydrophilic to prevent the deposited material from sticking on the banks and to ensure the subpixel is filled properly. The insulating material 704 thus forms wells, and the bottoms may include different electrodes (e.g., anodes) for each subpixel. In the embodiment shown, the light-emitting devices include first electrodes 706A and 706B, a second electrode 707 which may be common to both (or all) light-emitting devices in the bank structure, first charge transport layers 705A and 705B, CCTELs 703A and 703B, and second charge transport layers 701A and 701B, such that each light-emitting device 700A and 700B may be configured generally similar to the embodiment depicted in FIG. 3. The bank structure may include light-emitting devices configured and/or fabricated in accordance with any of the embodiments.

In an exemplary embodiment, the light emitting devices of the bank structure 700 are top-emitting devices, and thus the first electrodes 706A and 706B are anodes and the second electrode 707 is a cathode (and again the cathode may be common between subpixels 700A and 700B). The first charge transport layers 705A and 705B are preferably deposited commonly (i.e. to both sub-pixels at the same time and with the same material and thickness), but alternatively may be deposited individually (i.e. patterned) for the different subpixels. The CCTEL 703A includes a first quantum dot type with a first emission wavelength, and the CCTEL 703B includes a second quantum dot type with a second emission wavelength different from the first emission wavelength. The second charge transport layers 701A and 701B are preferably deposited commonly (i.e. to both sub-pixels at the same time and with the same material and thickness), but alternatively may be deposited individually (i.e. patterned) for the different subpixels.

It is known that for top-emitting devices that include reflective electrodes (e.g. the first electrodes 706A, 7060B) and partially reflective electrodes (e.g. the second electrode 707), an optical cavity can be established for the light emitted from quantum dots by electroluminescence. The distance between the quantum dots emitting light and the first electrode, and the distance between the quantum dots emitting light and the second electrode, can have a significant effect on the optical mode of the cavity, and consequently on the properties of the light emitted through the second electrode 707. For example, such parameters can affect the efficiency of light escaping from the light emitting device, and the dependence of intensity and wavelength on emission direction. Therefore, it is often preferable to select the thickness of layers disposed between the quantum dots and the electrodes to provide a favorable optical cavity for optimal light efficiency. Suitable thicknesses are different for different wavelengths of light (e.g. different between a device emitting red light and a device emitting green light).

A significant advantage of the CCTEL of types described in connection with FIGS. 4B, 4C, 4D, and 4E, and especially for the layered distribution of QDs in FIGS. 4C/4C2 and 4E/4E2, is that the distance between the quantum dots and the pertinent electrode can be selected according to the thickness of the CCTEL. For example, referring to FIG. 7A, wherein the first electrodes 706A and 706B are anodes, with a CCTEL 703A and 703B configured as in FIG. 4C or 4C2 in which the charge transport material of the CCTEL is a hole transporting layer, the distance between the quantum dots and the reflective anode may be adjusted by adjusting the overall thickness of the CCTEL. Consequently, as illustrated in FIG. 7A, the CCTEL 703A and CCTEL 703B may be provided with different thicknesses to provide favorable distances between the quantum dots and the anode as individually required for the wavelength of light emitted from the quantum dots in CCTEL 703A and for the wavelength of light emitted from the quantum dots in CCTEL 703B, respectively. Therefore, favorable optical cavity length and different wavelengths are achieved by depositing only the CCTEL individually between the sub-pixels. It is not necessary to deposit other charge transport layers individually between the sub-pixels to provide the suitable distance between the quantum dots and the reflective electrode. In an example, only the CCTEL is deposited individually between the subpixels and all other layers are deposited commonly to the two subpixels. In another example, the light emitting devices of the bank structure 700 are bottom emitting devices, for which the distance between the emitting quantum dots and the reflective electrode can affect the light emission due to cavity effects. Therefore, for bottom emitting devices CCTEL of the type depicted in FIG. 4E or 4E2 is advantageous for comparable reasons.

An example of a light-emitting device may be produced as follows in accordance with another embodiment of the present application. 150 nm of ITO is sputtered through a shadow mask onto a 1 mm thick glass substrate to define a semi-transparent anode region. PEDOT:PSS in aqueous solution is deposited on top of the anode by spin coating then baked at 150° C. to form a hole injection layer. InP quantum dots, a cross-linkable material with hole transporting properties, and a photo initiator are deposited and patterned by the above-described deposition method exemplified in FIGS. 6A-6E. MgZnO nanoparticles are deposited on top of the emissive layer by spin coating from ethanol followed by baking at 80° C. to form an electron transport layer. 100 nm of aluminium is thermally evaporated on top of the electron transport layer to provide a reflective cathode. The above-described process yields a light-emitting device having a 1 mm glass substrate; a 150 nm ITO anode; a 50 nm PEDOT: PSS hole injection layer; a CCTEL including a 60 nm portion composed mainly of the crosslinked hole transporting material that acts as a hole transporting layer, and a 15 nm portion mainly composed of QDs that act as emissive layer; a 60 nm MgZnO electron transport layer; and a 100 nm Al cathode.

An aspect of the invention, therefore, is a light-emitting device that includes a combined charge transport and emissive layer (CCTEL) to enhance light output efficiency. In exemplary embodiments, the light-emitting device includes an anode; a cathode; and a combined charge transport and emissive layer (CCTEL) disposed between the anode and the cathode, the CCTEL comprising a crosslinked charge transport material and quantum dots. The quantum dots are distributed unevenly within the crosslinked charge transport material. The light-emitting device may include one or more of the following features, either individually or in combination.

In an exemplary embodiment of the light-emitting device, the quantum dots are segregated from the crosslinked charge transport material whereby the quantum dots are located in a half portion of the CCTEL closest to the cathode.

In an exemplary embodiment of the light-emitting device, the quantum dots are segregated from the crosslinked charge transport material to form a monolayer of quantum dots at an outer surface of the CCTEL closest to the cathode.

In an exemplary embodiment of the light-emitting device, the quantum dots are segregated from the crosslinked charge transport material whereby the quantum dots are located in a half portion of the CCTEL closest to the anode.

In an exemplary embodiment of the light-emitting device, the quantum dots are segregated from the crosslinked charge transport material to form a monolayer of quantum dots at an outer surface of the CCTEL closest to the anode.

In an exemplary embodiment of the light-emitting device, the crosslinked charge transport material comprises a hole transport material.

In an exemplary embodiment of the light-emitting device, the crosslinked charge transport material comprises an electron transport material.

In an exemplary embodiment of the light-emitting device, the light-emitting device further includes a hole transport layer disposed between the anode and the CCTEL.

In an exemplary embodiment of the light-emitting device, the hole transport layer is crosslinked with the crosslinked material of the CCTEL.

In an exemplary embodiment of the light-emitting device, the light-emitting device further includes an electron transport layer disposed between the cathode and the CCTEL.

In an exemplary embodiment of the light-emitting device, the electron transport layer is crosslinked with the crosslinked material of the CCTEL.

In an exemplary embodiment of the light-emitting device, the CCTEL further comprises one or more photo initiators.

Another aspect of the invention is a bank structure of multiple light-emitting devices that includes a first light emitting device according to any of the embodiments, and a second light-emitting device according to any of the embodiments. The bank structure further includes an insulating material that separates at least a portion of the first light-emitting device from the second light emitting device; wherein the first light-emitting device and the second light-emitting device are configured to emit wavelengths of different color. The first light-emitting device and the second light emitting device may have different CCTELs, and the first light-emitting device and the second light-emitting device may share at least one layer other than the CCTELs in common.

Another aspect of the invention is a method of forming a combined charge transport and emissive layer (CCTEL) of a light-emitting device. In exemplary embodiments, the method includes the steps of depositing a mixture comprising quantum dots and a cross-linkable material in a solvent on a base layer; and subjecting at least a portion of the mixture to an activation stimulus to crosslink the cross-linkable material. During at least one of the depositing and subjecting steps, the CCTEL phase separates to include a first portion and a second portion that are linked to each other, and wherein the first portion comprises mainly the crosslinked material relative to the second portion, and the second portion comprises mainly quantum dots that segregate from the crosslinked material. The method may include one or more of the following features, either individually or in combination.

In an exemplary embodiment of a method of forming of a CCTEL, the phase separation occurs at least partially during the deposition of the mixture as the solvent evaporates.

In an exemplary embodiment of a method of forming of a CCTEL, the phase separation occurs at least partially during application of the activation stimulus.

In an exemplary embodiment of a method of forming of a CCTEL, the activation stimulus comprises at least one of ultraviolet (UV) light exposure, heating, application of pressure, and pH change.

In an exemplary embodiment of a method of forming of a CCTEL, the mixture further comprises a photo initiator, and the activation stimulus includes exposure to UV light.

In an exemplary embodiment of a method of forming of a CCTEL, the base layer includes a hole transport layer comprising a cross-linkable hole transport material, and the activation stimulus crosslinks the hole transport layer with the first portion of the CCTEL, or the base layer includes an electron transport layer comprising a cross-linkable electron transport material, and the activation stimulus crosslinks the electron transport layer with the first portion of the CCTEL.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

INDUSTRIAL APPLICABILITY

The present invention relates to QD-LED devices that, for example, may be used for light-emitting elements in a display device. Embodiments of the present invention are applicable to many display devices to permit display devices of high resolution and high image quality. Examples of such devices include televisions, mobile phones, personal digital assistants (PDAs), tablet and laptop computers, desktop monitors, digital cameras, and like devices for which a high-resolution display is desirable.

REFERENCE SIGNS LIST

101—QD core
102—QD shell
103—QD ligands
104—QD core+shell
200—QD-LED structure

201—substrate
202—first electrode
203—first charge transport layers
204—emissive layer
205—second charge transport layers
206—second electrode
300—QD-LED light-emitting device structure
301—substrate
302—first electrode
303—first charge transport layers
305—second charge transport layers
306—second electrode
307—combined charge transport and emissive layer (CCTEL)
401—quantum dots
402—charge transport material
403—underlayer
501—cross-linkable material
502—QDs
503—solvent
504—substrate
505—layer of QDs
506—crosslinked material
601—substrate
602—first electrode
603—deposition mixture
604—solvent
605—cross-linkable material
606—quantum dots
607—mask
608—ultraviolet light
609—quantum dot layer
610—crosslinked matrix
620—CCTEL layer
700—bank structure
700A—first subpixel
700B—second subpixel
701A—second charge transport layer A
701B—second charge transport layer B
703A—CCTEL A
703B—CCTEL B
704—insulating material
705A—first charge transport layer A
705B—first charge transport layer B
706A—first electrode A
706B—first electrode B
707—second electrode
708—substrate

What is claimed is:

1. A light-emitting device, comprising:
an anode;
a cathode; and
a combined charge transport and emissive layer (CCTEL) disposed between the anode and the cathode, the CCTEL comprising a crosslinked charge transport material and quantum dots;
wherein the quantum dots are distributed unevenly within the crosslinked charge transport material.

2. The light-emitting device of claim 1, wherein the quantum dots are segregated from the crosslinked charge transport material whereby the quantum dots are located in a half portion of the CCTEL closest to the cathode.

3. The light-emitting device of claim 2, wherein the quantum dots are segregated from the crosslinked charge transport material to form a monolayer of quantum dots at an outer surface of the CCTEL closest to the cathode.

4. The light-emitting device of claim 1, wherein the quantum dots are segregated from the crosslinked charge transport material whereby the quantum dots are located in a half portion of the CCTEL closest to the anode.

5. The light-emitting device of claim 4, wherein the quantum dots are segregated from the crosslinked charge transport material to form a monolayer of quantum dots at an outer surface of the CCTEL closest to the anode.

6. The light-emitting device of claim 1, wherein the crosslinked charge transport material comprises a hole transport material.

7. The light-emitting device of claim 1, wherein the crosslinked charge transport material comprises an electron transport material.

8. The light-emitting device of claim 1, further comprising a hole transport layer disposed between the anode and the CCTEL.

9. The light-emitting device of claim 8, wherein the hole transport layer is crosslinked with the crosslinked material of the CCTEL.

10. The light-emitting device of claim 1, further comprising an electron transport layer disposed between the cathode and the CCTEL.

11. The light-emitting device of claim 10, wherein the electron transport layer is crosslinked with the crosslinked material of the CCTEL.

12. The light-emitting device of claim 1, wherein the CCTEL further comprises one or more photo initiators.

13. A bank structure of multiple light-emitting devices comprising:
a first light emitting device according to claim 1;
a second light-emitting device according to claim 1; and
an insulating material that separates at least a portion of the first light-emitting device from the second light emitting device;
wherein the first light-emitting device and the second light-emitting device are configured to emit wavelengths of different color.

14. The bank structure of claim 13, wherein the first light-emitting device and the second light emitting device have different CCTELs, and the first light-emitting device and the second light-emitting device share at least one layer other than the CCTELs in common.

* * * * *